(12) United States Patent
Tsukahara et al.

(10) Patent No.: US 8,517,551 B2
(45) Date of Patent: Aug. 27, 2013

(54) PHOSPHOR SHEET, A DIFFUSION PLATE, AN ILLUMINATING DEVICE, AND A DISPLAY UNIT

(75) Inventors: Tsubasa Tsukahara, Tokyo (JP); Naoji Nada, Kanagawa (JP); Ryo Kasegawa, Chiba (JP); Yasushi Ito, Tochigi (JP); Yoshihiro Oshima, Kanagawa (JP)

(73) Assignee: Dexerials Corporation, Tokyo (JP)

( * ) Notice: Subject to any disclaimer, the term of this patent is extended or adjusted under 35 U.S.C. 154(b) by 378 days.

(21) Appl. No.: 12/823,361

(22) Filed: Jun. 25, 2010

(65) Prior Publication Data

US 2011/0002140 A1 Jan. 6, 2011

(30) Foreign Application Priority Data

Jul. 3, 2009 (JP) ................. P2009-159042

(51) Int. Cl.
*F21V 9/16* (2006.01)
(52) U.S. Cl.
USPC ............. 362/84; 362/97.3; 362/246; 362/293
(58) Field of Classification Search
USPC ................. 362/84, 97.3, 97.4, 240, 246, 244, 362/293; 313/498
See application file for complete search history.

(56) References Cited

U.S. PATENT DOCUMENTS

| | | | |
|---|---|---|---|
| 7,052,152 B2 * | 5/2006 | Harbers et al. | 362/30 |
| 7,654,681 B2 * | 2/2010 | Kim et al. | 362/97.4 |
| 7,819,539 B2 * | 10/2010 | Kim et al. | 362/84 |

FOREIGN PATENT DOCUMENTS

| | | |
|---|---|---|
| JP | 59-42500 | 3/1984 |
| JP | 6-58440 | 8/1994 |
| JP | A-2004-164977 | 6/2004 |
| JP | 2005-108635 | 4/2005 |
| JP | A-2007-005098 | 1/2007 |
| JP | 2007-23267 | 2/2007 |
| JP | A-2008-112711 | 5/2008 |

OTHER PUBLICATIONS

Japanese Patent Office, Notification of Reason(s) for Refusal mailed Dec. 18, 2012 in Japanese Patent Application No. 2009-159042 w/English-language Translation.

* cited by examiner

*Primary Examiner* — Anabel Ton
(74) *Attorney, Agent, or Firm* — Oliff & Berridge, PLC

(57) ABSTRACT

A phosphor sheet having a laminated structure including a first barrier material, a first barrier material, a first color conversion layer, a second color conversion layer, and a second barrier layer and a display unit and an illuminating device including display unit is provided. A diffusion plate and a display unit including a diffusion plate are also provided.

34 Claims, 12 Drawing Sheets

PHOSPHOR SHEET, A DIFFUSION PLATE, AN ILLUMINATING DEVICE, AND A DISPLAY UNIT

CROSS REFERENCES TO RELATED APPLICATIONS

The present application claims priority to Japanese Priority Patent Application JP 2009-159042 filed in the Japan Patent Office on Jul. 3, 2009, the entire contents of which is hereby incorporated by reference.

BACKGROUND

The present application relates to a color conversion element used for a liquid crystal display or the like and a display unit.

In the past, as a thin display unit, a liquid crystal display (LCD) has been used. In the liquid crystal display, a backlight irradiating the whole area of a liquid crystal panel from behind is used. The liquid crystal displays are classified broadly into direct lighting type and edge lighting type according to the structure of the backlight. In the edge lighting type, after light entering from the side face of a light guide plate is propagated inside the light guide plate, the light is extracted from the top face of the light guide plate. Meanwhile, in the direct lighting type, for example, a plurality of fluorescent lamps such as a CCFL (Cols Cathode Fluorescent Lamp) are arranged on a substrate, and thereby surface light emission is made as a whole (for example, see Japanese Unexamined Patent Application Publication No. 2005-108635).

In recent years, the liquid crystal display has been gotten larger, thinned, and lightened, and the life thereof has been lengthened. Further, in terms of improving moving picture characteristics by blinking control, a light emitting unit for performing surface light emission by arranging a plurality of light emitting diodes (LED) on a substrate has attracted attention. In such a light emitting unit, the following two methods are mainly used for extracting white light. In the first method, light emitting diodes that respectively emit each color of three colors R, G, and B are arranged, such light emitting diodes are concurrently lighted, and thereby the three color light is synthesized to obtain white light. In the second method, for example, a blue light emitting diode chip is surrounded by a resin containing a phosphor, and blue light is color-converted to white light.

However, in the foregoing second method, potting of the phosphor is made for a minute area of the light emitting diode chip. Thus, it is difficult to evenly and uniformly form the resin containing the phosphor. Thus, in recent years, as the third method replacing the second method, a method of color-converting blue light by using a material in which the resin containing the phosphor is sandwiched between a sheet base material (hereinafter referred to as a phosphor sheet) has attracted attention.

Meanwhile, in general, the phosphor is weak to oxygen and moisture vapor. When the phosphor is exposed to oxygen, moisture vapor and the like, the characteristics thereof are deteriorated. Thus, in the case where the phosphor sheet is used for the backlight, luminance and chromaticity deteriorates. Such deterioration of the phosphor is particularly significant under high temperature and high humidity environment. Thus, in the foregoing phosphor sheet, high moisture vapor barrier properties, high gas barrier properties and the like are needed for the sheet base material.

Thus, a method of providing a protective layer composed of a silicon compound or the like on the resin containing the phosphor (see Japanese Examined Patent Application Publication No. 6-58440) and a method of directly coating the surface of the resin containing the phosphor with a protective embrocation (refer to Japanese Unexamined Patent Application Publication No. 59-42500) have been proposed. Further, a method of sealing the resin containing the phosphor by sandwiching with two pieces of glass plates has been also proposed (see Japanese Unexamined Patent Application Publication No. 2007-23267).

SUMMARY

However, in the case where the methods of Japanese Examined Patent Application Publication No. 6-58440, Japanese Unexamined Patent Application Publication Nos. 59-42500, and 2007-23267 described above are used, for the purpose of protecting the phosphor, an expensive material such as a special protective layer and a glass plate should be used, resulting in a disadvantage of increased manufacturing cost. Thus, it is aspired that in an optical member in which color conversion is made by the phosphor such as a phosphor sheet, deterioration of the phosphor is prevented while an inexpensive material widely used for food packaging or the like is used as a sheet base material.

In view of the foregoing, in an embodiment, it is desirable to provide a color conversion element with which deterioration of a phosphor is able to be prevented at low cost and a display unit including the color conversion element.

According to an embodiment, there is provided a phosphor sheet having a laminated structure in which a first color conversion layer is provided on a first barrier material, the first color conversion layer includes a first color phosphor dispersed in a first resin layer, a second color conversion layer is provided on the first color conversion layer, the second color conversion layer includes a second color phosphor dispersed in a second resin layer, and a second barrier material is provided on the second color conversion layer.

According to an embodiment, there is provided a display unit comprising a display panel, a light source, and a phosphor sheet through which light emitted from the light source passes to illuminate the display panel, in which the phosphor sheet has a laminated structure including a first color conversion layer provided on a first barrier material, the first color conversion layer includes a first color phosphor dispersed in a first resin layer, a second color conversion layer is provided on the first color conversion layer, the second color conversion layer includes a second color phosphor dispersed in a second resin layer, and a second barrier material is provided on the second color conversion layer.

According to an embodiment, there is provided an illuminating device comprising a light source and a phosphor sheet through which light emitted from the light source passes, in which the phosphor sheet has a laminated structure including a first color conversion layer provided on a first barrier material, the first color conversion layer includes a first color phosphor dispersed in a first resin layer, a second color conversion layer is provided on the first color conversion layer, the second color conversion layer includes a second color phosphor dispersed in a second resin layer, and a second barrier material is provided on the second color conversion layer.

According to an embodiment, there is provided a diffusion plate including a first barrier material, a second barrier material, and a laminated structure provided between the first and second barrier materials, in which the laminated structure includes a first color conversion diffusion plate and a second color conversion diffusion plate provided on the first color conversion diffusion plate, a first adhesive layer provided on a top face of the laminated structure to seal the laminated structure to the first barrier material, and a second adhesive layer provided on a bottom face of the laminated structure to seal the laminated structure to the second barrier material, and in which the first color diffusion plate includes a first color phosphor dispersed therein and the second color diffusion plate includes a second color phosphor dispersed therein.

According to an embodiment, there is provided a display unit including a display panel, a light source, and a diffusion plate through which light emitted from the light source passes to illuminate the display panel, in which the diffusion plate comprises a first barrier material, a second barrier material, a laminated structure provided between the first and second barrier materials, and in which the laminated structure includes a first color conversion diffusion plate and a second color conversion diffusion plate, a first adhesive layer provided on a top face of the laminated structure to seal the laminated structure to the first barrier material, and a second adhesive layer provided on a bottom face of the laminated structure to seal the laminated structure to the second barrier material, the first color diffusion plate including a first color phosphor dispersed therein and the second color diffusion plate including a second color phosphor dispersed therein.

According to an embodiment, deterioration of the phosphor is easily inhibited. Thereby, deterioration of the phosphor is able to be inhibited even if an inexpensive material that is widely used for a food packaging or the like is used as the pair of base materials. Thus, deterioration of the phosphor is able to be inhibited at low cost.

Additional features and advantages are described herein, and will be apparent from, the following Detailed Description and the figures.

DETAILED DESCRIPTION

The present application will be hereinafter described in detail with reference to the drawings according to an embodiment. The description will be given in the following order:

1. First embodiment (phosphor sheet): example of separately coated two layer structure with an interlayer barrier film 2. First modified example: example without the interlayer barrier film 3. Second modified example: example that an adhesive corresponding to the phosphor type is used 4. Third modified example: example that an adhesive corresponding to the phosphor type is used (without the interlayer barrier film)

Figure 1:
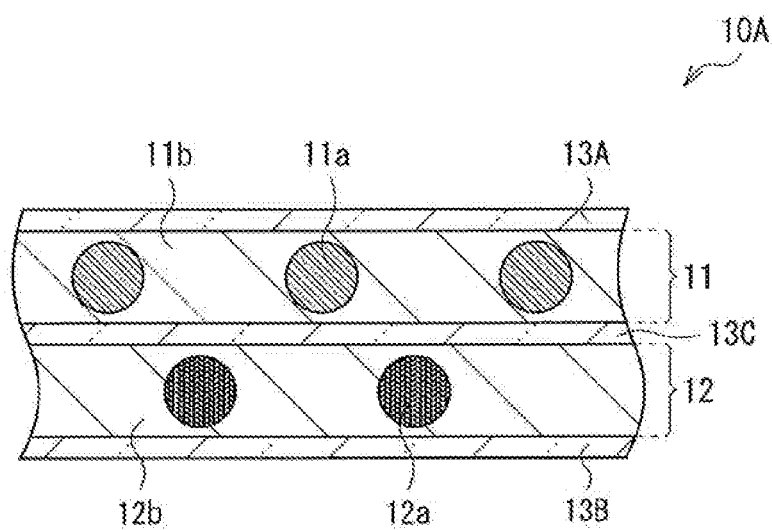
FIG. 1 is a schematic view illustrating a cross sectional structure of a phosphor sheet according to a first embodiment.

5. First to third application examples: examples of a display unit and a illuminating device including the phosphor sheet 6. Second embodiment (diffusion plate): example of a three-layer laminated structure sealed by using the same adhesive for both the upper side and the lower side 7. Fourth modified example: example of a two-layer laminated structure sealed by using respectively different adhesives for the upper side and the lower side First Embodiment Structure of phosphor sheet 10A FIG. 1 schematically illustrates a cross sectional structure of a phosphor sheet 10A according to a first embodiment. In the phosphor sheet 10A, a red conversion layer 12 and a green conversion layer 11 are sealed between barrier films 13A and 13B (a pair of base materials). The red conversion layer 12 is a color conversion layer for converting part of blue light to red light, and the green conversion layer 11 is a color conversion layer for converting part of blue light to green light, respectively. That is, the phosphor sheet 10A has a laminated structure in which each layer separately exists for every phosphor type. In this embodiment, a description will be given of a two layer structure composed of the red conversion layer 12 and the green conversion layer 11 as an example.

The red conversion layer 12 contains a resin layer 12b and a red phosphor 12a that is dispersed and contained in the resin layer 12b. The red phosphor 12a color-converts, for example, blue light as exciting light to red light. For example, the red phosphor 12a is $(Ca, Sr, Ba)S:Eu^{2+}$, $(Ca, Sr, Ba)_2Si_5N_8:Eu^{2+}$, $CaAlSiN_3:Eu^{2+}$ or the like. The red phosphor 12a is composed of powdery particles. Thus, the red phosphor 12a is fixed and held on a face of a barrier film 13B by the resin layer 12b as a binder resin. Examples of material of the resin layer 12b include an ink paste binder resin such as a polyvinyl butyral resin, a polyvinyl acetal resin, a phenol resin, an epoxy resin, and a melamine resin. In addition, for example, an adhesive functioning as a binder resin such as the following examples may be used. Examples include a urea resin system, a melamine resin system, a phenol resin system, a resorcinol resin system, an epoxy resin system, a polyurethane resin system, a polyimide system, a polybenzimidazole system, a polyester resin system, a vinyl acetate resin system, a polyvinyl acetal system, a polyvinyl alcohol system, a vinyl chloride resin system, a cyanoacrylate system, a polyether acrylate system, a polyethylene system, a cellulose system, a chloroprene rubber system, a nitrile rubber system, an SBR system, an SIS system, a polysulfide system, a butyl rubber system, a silicone rubber system, vinylphenolic, epoxyphenolic, chloroprenephenolic, nirilephenolic, nylon epoxy, and nitrile epoxy.

The green conversion layer 11 contains a resin layer 11b and a green phosphor 11a that is dispersed and contained in the resin layer 11b. The green phosphor 11a color-converts, for example, blue light as exciting light to green light. For example, the green phosphor 11a is $SrGa_2S_4:Eu^{2+}$, $Ca_3Sc_2Si_3O_{12}:Ce^{3+}$ or the like. The green phosphor 11a is composed of powdery particles as the red phosphor 12a. Thus, the green phosphor 11a is fixed and held on a face of the barrier film 13A by the resin layer 11b as a binder resin. As a material of the resin layer 11b, the resins listed in the foregoing resin layer 12b are used. A resin used for the resin layer 11b may be identical with or may be different from a resin used for the resin layer 12b. However, though details will be described later, a resin selected according to the phosphor type in each color conversion layer is desirably used.

The barrier films 13A and 13B are a base material sheet to support the red conversion layer 12 and the green conversion layer 11, and function as a protective layer of the red conversion layer 12 and the green conversion layer 11. Examples of material of the barrier films 13A and 13B include a thermoplastic resin such as polycarbonate (PC), polyethylene terephthalate (PET), polyethylene naphthalate (PEN), polystyrene (PS), polyether sulfone (PES) and cyclic amorphous polyolefin, and a transparent resin such as multifunctional acrylate, multifunctional polyolefin, unsaturated polyester, and an epoxy resin. A material having relatively low barrier performance such as moisture vapor transmittance of the barrier films 13A and 13B of about from 0.05 to 5 $g/m^2/day$, for example, about 0.1 $g/m^2/day$ is suitably used. The thickness is, for example, from 10 μm to 1000 μm both inclusive.

In this embodiment, a barrier film 13C (interlayer barrier film) is further provided between the red conversion layer 12 and the green conversion layer 11. The material, the thickness, and the moisture vapor transmittance of the barrier film 13C are similar to those of the barrier films 13A and 13B.

Such a phosphor sheet 10A is able to be formed, for example, as follows. That is, first, the red phosphor 12a is mixed in a solvent containing a binder resin. A face of the barrier film 13B is coated or printed with the resultant mixed solution, and then dried. Thereby, the red conversion layer 12 is formed on the face of the barrier film 13B (the red phosphor is fixed thereon). Similarly, the green phosphor 11a is mixed in a solvent containing a binder resin. A face of the barrier film 13A is coated or printed with the resultant mixed solution, and then dried. Thereby, the green conversion layer 11 is formed on the face of the barrier film 13A (the green phosphor is fixed thereon). The red conversion layer 12 and the green conversion layer 11 formed as above are bonded with each other by using an adhesive or the like with the barrier film 13C in between. In the case where an adhesive is used as a binder resin, fixing each color phosphor onto each barrier film and bonding each barrier film with each other are concurrently made by using the adhesive. At this time, fixing and bonding are made according to a curing method of the adhesive (for example, thermal curing type, ultraviolet curing type or the like). Thereby, the phosphor sheet 10A is formed.

Operation and Effect of Phosphor Sheet 10A

In this embodiment, in the case where blue light enters a face of the phosphor sheet 10A, for example, the barrier film 13B side of the phosphor sheet 10A, the incident blue light sequentially passes the red conversion layer 12 and the green conversion layer 11. In the course of light passing, part of the blue light is color-converted to red light and green light, respectively, which is emitted from the barrier film 13A side. The green light and the red light are mixed with blue light that has not been color-converted and has passed the fluorescence sheet 10A, and thereby white light is obtained.

Figure 2A:
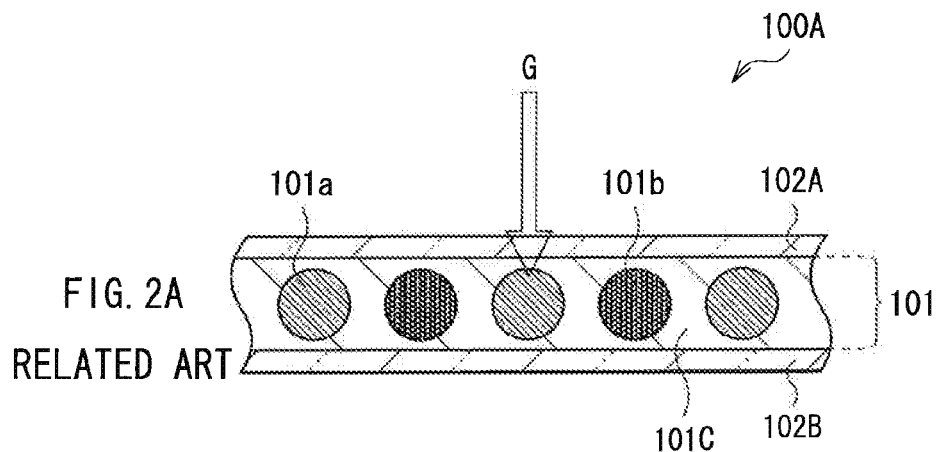
FIGS. 2A and 2B are schematic views illustrating a cross sectional structure of a phosphor sheet according to a comparative example.

A description will be given of phosphor sheets 100A and 100B according to Comparative examples 1 and 2 with reference to FIGS. 2A and 2B. As illustrated in FIG. 2A, the phosphor sheet 100A of Comparative example 1 has a color conversion layer 101 between a pair of base material sheets 102A and 102B. In the color conversion layer 101, a green phosphor 101a and a red phosphor 101b are mixed and held in a resin layer 101c. However, a phosphor such as the green phosphor 101a and the red phosphor 101b is generally weak to moisture vapor, oxygen or the like. Thus, there is a possibility that the phosphor is deteriorated by gas G such as moisture vapor passed the pair of base material sheets 102A and 102B.

Figure 2B:
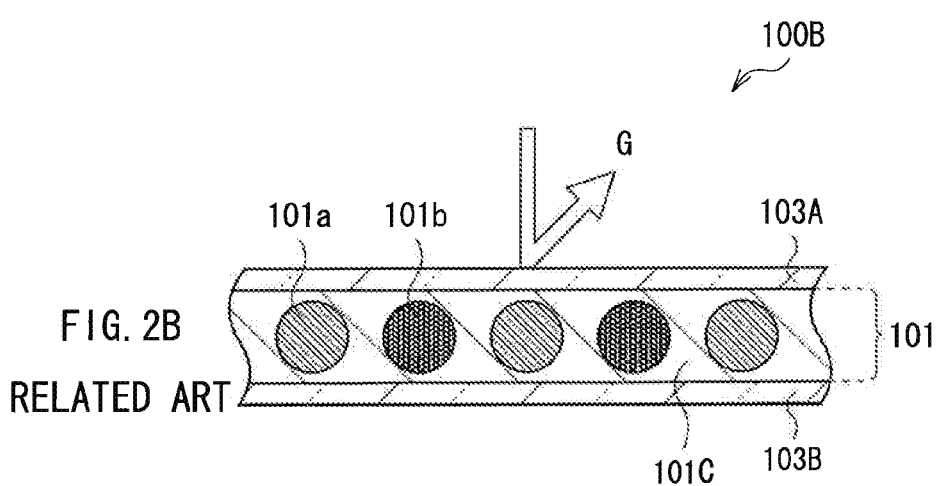

Thus, it is necessary that the color conversion layer 101 is sandwiched between high barrier films 103A and 103B having high gas barrier characteristics as the phosphor sheet 100B according to Comparative example 2 illustrated in FIG. 2B. The high barrier films 103A and 103B have a significantly high barrier function with a moisture vapor transmission of 0.05 $g/m^2/day$ or less. In such high barrier films 103A and 103B, a plurality of inorganic films composed of silicon oxide ($SiO_x$), aluminum oxide ($Al_2O_3$) or the like are layered on a resin film such as a PET. Further, in some cases, an inorganic film and an organic film are layered. Further, in some cases, a glass substrate or the like is used. Thereby, passing of the gas G is able to be effectively prevented, and deterioration of the phosphor is able to be suppressed. However, for such high barrier films 103A and 103B, development thereof is significantly difficult, the material cost is high, and the manufacturing cost mounts.

Meanwhile, in this embodiment, each layer separately exists for every phosphor type (the red phosphor 12a and the green phosphor 11b). That is, the color conversion layer is divided into the red conversion layer 12 and the green conversion layer 11, and the barrier film 103C is provided therebetween. Thereby, compared to the case that the green phosphor 101a and the red phosphor 101b that are mixed in the same layer is sealed with the base material sheets 102A and 102B as in Comparative example 1, deterioration of the phosphor is easily suppressed.

As described above, in this embodiment, the color conversion layer is divided into the red conversion layer 12 containing the red phosphor 12a and the green conversion layer 11 containing the green phosphor 11a. Thus, compared to the case that the foregoing phosphors are mixed in the same layer, deterioration of the respective phosphors is easily suppressed. Specifically, in the red conversion layer 12, entering of moisture vapor or the like from the barrier film 13B (bottom face) side is inhibited by the barrier film 13B, while entering of moisture vapor or the like from the barrier film 13A (top face)

side is inhibited by the barrier films 13A and 13C. Similarly, in the green conversion layer 11, entering of moisture vapor or the like from the barrier film 13A (top face) side is inhibited by the barrier film 13A, while entering of moisture vapor or the like from the barrier film 13B (bottom face) side is inhibited by the barrier films 13B and 13C.

Thus, deterioration of the phosphor is able to be inhibited while an inexpensive barrier film (for example, a film in which alumina or silica is layered on PET or PEN) that is widely used for a food packaging or the like is used as the barrier films 13A to 13C sandwiching the red conversion layer 12 and the green conversion layer 11. Thus, deterioration of the phosphor is able to be inhibited at low cost. Further, by inhibiting deterioration of the phosphor, chromaticity change and luminance change after long time usage are able to be decreased.

EXAMPLE 1

Figure 3A:
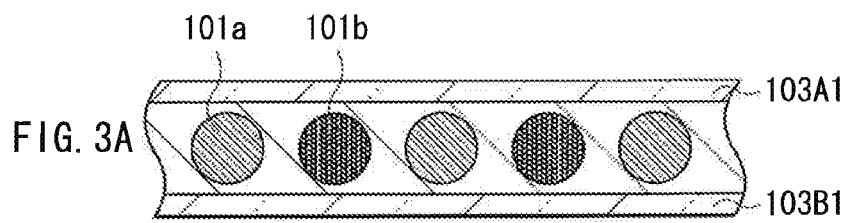
FIGS. 3A to 3C are schematic views illustrating a cross sectional structure of a phosphor sheet according to Example 1, Comparative example 1-1, and Comparative example 1-2.
Figure 3B:
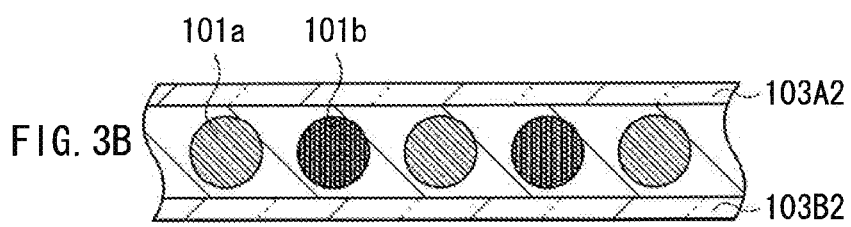
Figure 3C:
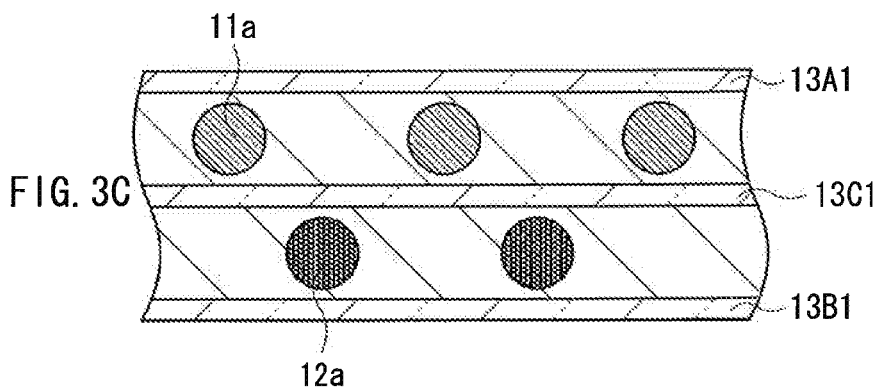

Samples (samples 1 to 3) of the following phosphor sheets were practically formed, and deterioration of the phosphor (chromaticity change) was examined. Specifically, Sample 1 as illustrated in FIG. 3A as Comparative example 1-1 and Sample 2 as illustrated in FIG. 3B as Comparative example 1-2 were formed. Sample 3 as illustrated in FIG. 3C was formed as Example 1. Sample 1 corresponds to the structure of Comparative example 2 described above, and had a structure that the color conversion layer 101 in which the green phosphor 101a and the red phosphor 101b were mixed and contained was sandwiched between high barrier films 103A1 and 103B1 (moisture vapor transmittance: 0.01 g/m$^2$/day). Sample 2 had a structure that the color conversion layer 101 in which the green phosphor 101a and the red phosphor 101b were mixed and contained was sandwiched between low barrier films 103A2 and 103B2 (moisture vapor transmittance: 0.1 g/m$^2$/day). Sample 3 had a structure that the red conversion layer 12 containing the red phosphor 12a and the green conversion layer 11 containing the green phosphor 11a were sandwiched between low barrier films 13A1 and 13B1, and a low barrier film 13C1 was provided between the red conversion layer 12 and the green conversion layer 11. The moisture vapor transmittance of the low barrier films 13A1, 13B1, and 13C1 was respectively 0.1 g/m$^2$/day. In Samples 1 to 3, a phosphor emitting red light with the use of blue light as exciting light was used as a red phosphor; and a phosphor emitting green light with the use of blue light as exciting light was used as a green phosphor, respectively. In both the foregoing phosphors, deterioration under high temperature and high humidity was large. As an exciting light source, a blue LED was used. Samples 1 to 3 were left for 300 hours under environment of 60 deg C. and 90% RH, and the chromaticity change amount ($\Delta u'$, $v'$) from the initial point was measured. The results are illustrated in FIG. 4.

Figure 4:
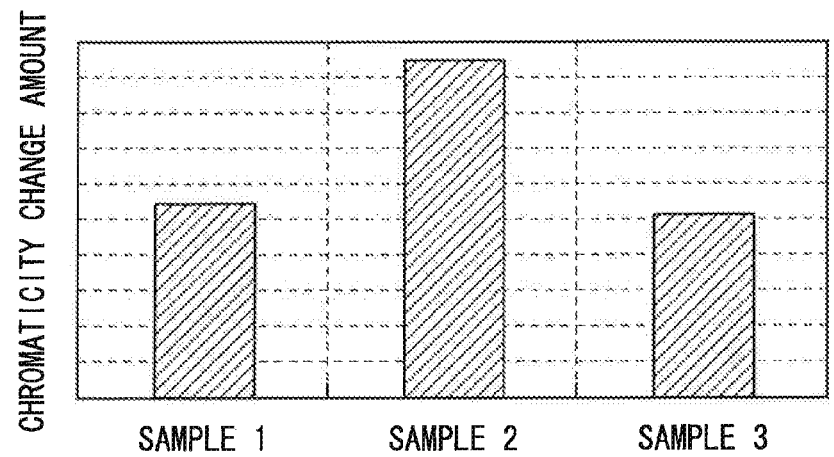
FIG. 4 is a diagram illustrating color shift amounts according to Example 1, Comparative example 1-1, and Comparative example 1-2.

As illustrated in FIG. 4, comparing Sample 1 to Sample 2, the chromaticity change in Sample 1 using the high barrier film was smaller than that of Sample 2 using the low barrier film. Meanwhile, in Sample 3 (Example 1), though the low barrier film was used, the chromaticity change was suppressed to the same degree as that of Sample 1 using the high barrier film. From the foregoing results, it was found that in the case where each color conversion layer separately existed for every phosphor type, and the barrier film was provided between the respective layers, deterioration of the phosphor was able to be effectively inhibited while an inexpensive low barrier film was used.

Next, a description will be given of modified examples (first to third modified examples) of the foregoing first embodiment. For elements similar to those of the first embodiment, the same referential symbols will be affixed thereto, and the description will be omitted as appropriate.

FIRST MODIFIED EXAMPLE

Figure 5:
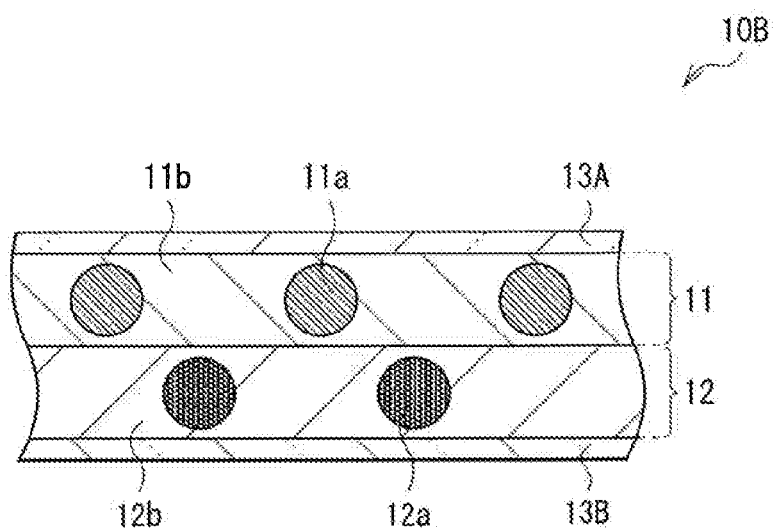
FIG. 5 is a schematic view illustrating a cross sectional structure of a phosphor sheet according to a first modified example.

FIG. 5 schematically illustrates a cross sectional structure of a phosphor sheet 10B according to the first modified example. As the phosphor sheet 10A of the foregoing first embodiment, the phosphor sheet 10B has a two layer structure composed of the red conversion layer 12 and the green conversion layer 11 between the pair of barrier films 13A and 13B. The phosphor sheet 10B of this modified example is different from the phosphor sheet 10A of the foregoing first embodiment, in that the barrier film (barrier film 13C) is not provided between the red conversion layer 12 and the green conversion layer 11. The phosphor sheet 10B is able to be formed, for example, as follows. That is, in the same manner as that of the foregoing first embodiment, after the green conversion layer 11 is formed on one face of the barrier film 13A and the red conversion layer 12 is formed on one face of the barrier film 13B, respectively, the red conversion layer 12 and the green conversion layer 11 are oppositely bonded with each other.

Figure 6:
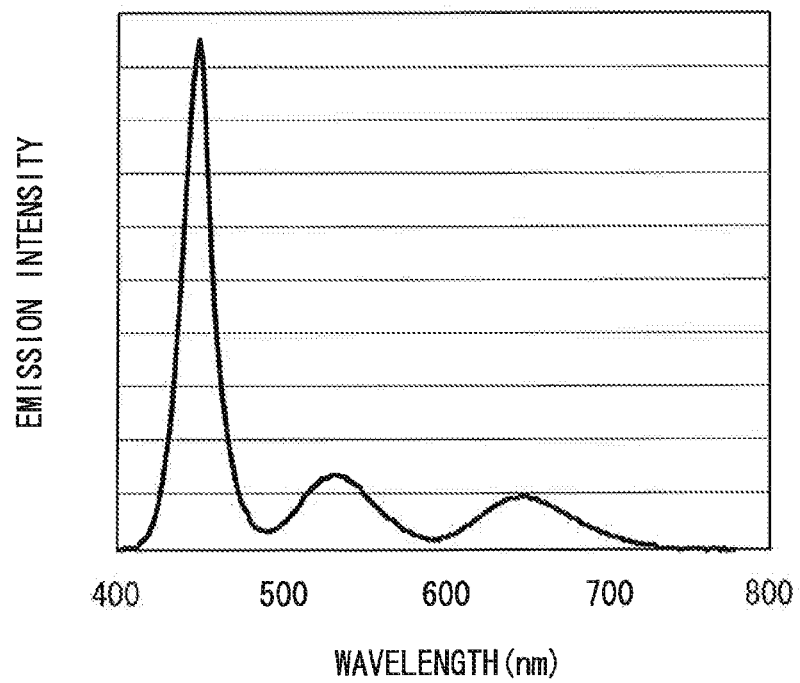
FIG. 6 is a diagram illustrating a spectrum of output light from the phosphor sheet illustrated in FIG. 5.

As described above, the barrier film (barrier film 13C) is not necessarily provided between the red conversion layer 12 and the green conversion layer 11. Even if such a barrier film does not exist, by forming the laminated structure in which each layer respectively exists for every phosphor type, deterioration of the phosphor is able to be easily inhibited. In the case where a phosphor having normalized light emitting spectrum peak of 600 or more is used as the red phosphor 12a, and a phosphor having normalized light emitting spectrum peak from 500 to 600 both inclusive is used as the green phosphor 11a, respectively, for example, white light having chromaticity (0.20 and 0.14) showing spectrum as illustrated in FIG. 6 is able to be obtained.

SECOND MODIFIED EXAMPLE

Figure 7:
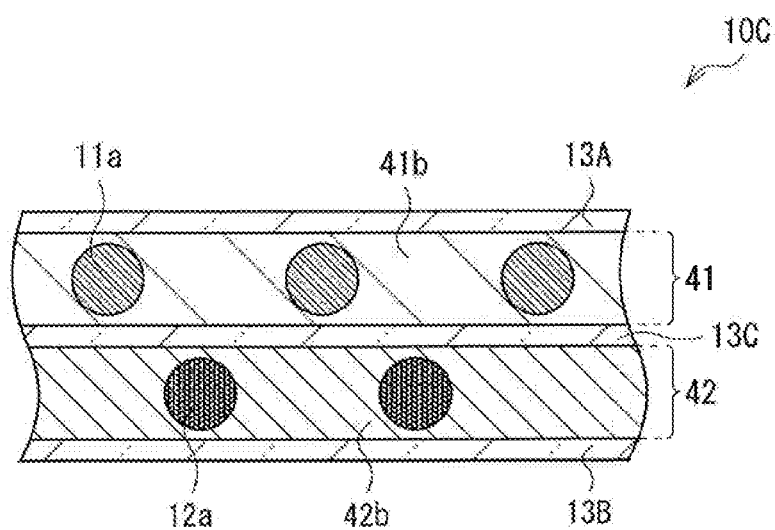
FIG. 7 is a schematic view illustrating a cross sectional structure of a phosphor sheet according to a second modified example.

FIG. 7 schematically illustrates a cross sectional structure of a phosphor sheet 10C according to the second modified example. As the phosphor sheet 10A of the foregoing first embodiment, the phosphor sheet 10C has a two layer structure composed of a red conversion layer 42 containing the red phosphor 12a and the green conversion layer 41 containing the green phosphor 11a between the pair of barrier films 13A and 13B. However, the phosphor sheet 10C of this modified example is different from the phosphor sheet 10A of the foregoing first embodiment, in that adhesive layers 41b and 42b respectively containing different adhesives are provided as a resin layer for retaining each phosphor in the green conversion layer 41 and the red conversion layer 42.

That is, in this modified example, though the green conversion layer 41 contains the green phosphor 11a, the green phosphor 11a is fixed and held on a face of the barrier film 13A by the adhesive layer 41b. The adhesive layer 41b contains an adhesive that is compatible with the green phosphor 11a and effectively inhibits deterioration of the green phosphor 11a (compatible with the green phosphor 11a). Meanwhile, the red conversion layer 42 contains the red phosphor 12a. The red phosphor 12a is fixed and held on a face of the barrier film 13B by the adhesive layer 42b. The adhesive layer 42b contains an adhesive that effectively inhibits deterioration of the red phosphor 11a (compatible with the red phosphor 11a).

Examples of materials of the adhesive layers 41b and 42b include an adhesive functioning as a binder resin of each phosphor such as a urea resin system, a melamine resin system, a phenol resin system, a resorcinol resin system, an epoxy resin system, a polyurethane resin system, a polyimide system, a polybenzimidazole system, a polyester resin system, a vinyl acetate resin system, a polyvinyl acetal system, a polyvinyl alcohol system, a vinyl chloride resin system, a cyanoacrylate system, a polyether acrylate system, a polyethylene system, a cellulose system, a chloroprene rubber system, a nitrile rubber system, an SBR system, an SIS system, a polysulfide system, a butyl rubber system, a silicon rubber system, vinylphenolic, epoxyphenolic, chloroprenephenolic, nitrilephenolic, nylon epoxy, and nitrile epoxy.

However, in this modified example, an adhesive selected according to the phosphor type is used in the adhesive layers 41b and 42b, since a compatible combination of a phosphor and an adhesive and an incompatible combination of a phosphor and an adhesive exist. For example, in the green conversion layer 41, as a material of the adhesive layer 41b, an adhesive capable of effectively inhibiting deterioration of the green florescence substance 11a such as an acrylic adhesive is used. In the red conversion layer 42, as a material of the adhesive layer 42b, an adhesive capable of effectively inhibiting deterioration of the red florescence substance 12a such as a butyl rubber adhesive is used. The acrylic adhesive and the butyl rubber adhesive may be heat curing type or ultraviolet curing type. As an adhesive used for the adhesive layers 41b and 42b, an adhesive functioning as a binder resin as described above may be used, or other type of adhesive may be used. In the latter case, in addition to the foregoing adhesive, other resin material functioning as a binder resin (not illustrated in FIG. 7), for example, an ink paste binder resin such as a polyvinyl butyral resin, a polyvinyl acetal resin, a phenol resin, an epoxy resin, and a melamine resin is used.

For examining deterioration behavior difference according to the combinations of a phosphor and an adhesive as described above, samples were formed. At this time, two types of samples were formed. One thereof was obtained by printing a green phosphor (SrGaS$_4$:Eu) on a PET film by using an acrylic adhesive (ultraviolet curing type). The other thereof was obtained by printing the green fluorescence (SrGaS$_4$: Eu) on a PET film by using a butyl rubber adhesive (heat curing type). Two types of samples were left under environment of 85 deg C. and 85% RH. Similarly, two types of samples were formed for the red phosphor (CaS:Eu), and left under similar environment. Temporal change of luminance of these samples (relative luminance in the case where the initial luminance is 1) is illustrated in FIGS. 8A and 8B.

Figure 8A:
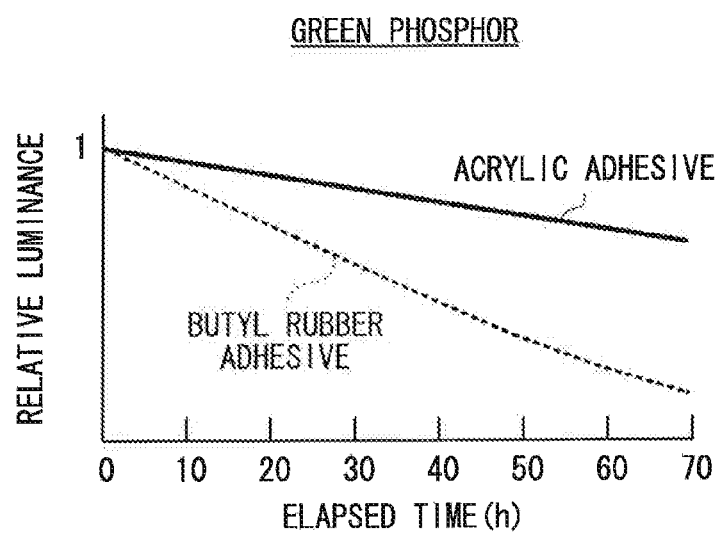
FIGS. 8A and 8B are diagrams for explaining compatibility between phosphor type and an adhesive.
Figure 8B:
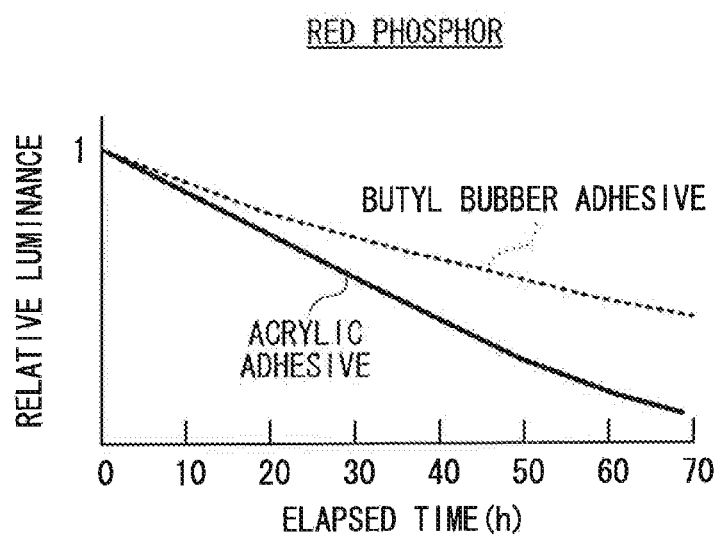

As illustrated in FIGS. 8A and 8B, in both the green phosphor 11a and the red phosphor 12a, deterioration behavior in the case where the acrylic adhesive was used was different from deterioration behavior in the case where the butyl rubber adhesive was used. As illustrated in FIG. 8A, in the green phosphor 11a, luminance lowering degree in the case where the acrylic adhesive was used was smaller than that in the case where the butyl rubber adhesive was used, and it was found that deterioration of phosphor was effectively inhibited. Meanwhile, as illustrated in FIG. 8B, in the red phosphor 12a, luminance lowering degree in the case where the butyl rubber adhesive was used was smaller than that in the case where the acrylic adhesive was used, and it was found that deterioration of the phosphor was effectively inhibited. The reason thereof may be as follows. In the case where an incompatible adhesive is used, the phosphor is deteriorated and decomposed, and thereby pH of the ambient surrounding is changed to acidic property and alkaline property. Such environment change causes deterioration of the adhesive, which further accelerates deterioration of the phosphor. Such vicious circle may be the reason thereof. As described above, in terms of inhibiting deterioration of the phosphor, it is found that a suitable combination of the phosphor type (the green phosphor 11a and the red phosphor 12a) and the adhesive type exists.

Thus, in this modified example, by focusing attention on the fact that a suitable combination of a phosphor and an adhesive exists, in the two layer structure composed of the green conversion layer 41 and the red conversion layer 42, different adhesives are used in the green conversion layer 41 and the red conversion layer 42. That is, while the green phosphor 11a is diffused (contained) in the adhesive layer 41b made of the acrylic adhesive in the green conversion layer 41, the red phosphor 12a is diffused (contained) in the adhesive layer 42b made of the butyl rubber adhesive in the red conversion layer 42. Thereby, the difference among respective deterioration rates of respective fluorescence types, that is, the difference among respective deterioration rates of respective colors is decreased, and temporal change in chromaticity of white light is inhibited. Thus, deterioration of the phosphor is able to be more effectively inhibited than in the foregoing first embodiment.

THIRD MODIFIED EXAMPLE

Figure 9:
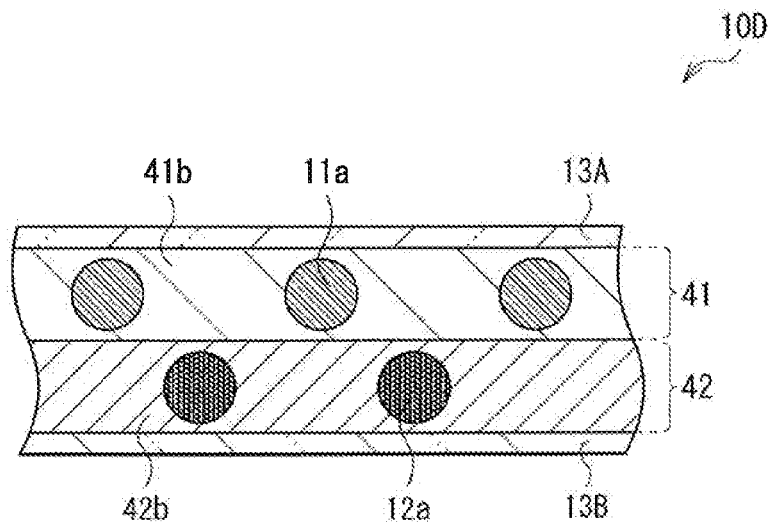
FIG. 9 is a schematic view illustrating a cross sectional structure of a phosphor sheet according to a third modified example.

FIG. 9 schematically illustrates a cross sectional structure of a phosphor sheet 10D according to the third modified example. As the phosphor sheet 10A of the foregoing first embodiment, the phosphor sheet 10D has a two layer structure composed of the red conversion layer 42 containing the red phosphor 12a and the green conversion layer 41 containing the green phosphor 11a between the pair of barrier films 13A and 13B. Further, as in the foregoing second modified example, in the green conversion layer 41 and the red conversion layer 42, as a resin layer for retaining each phosphor, different adhesive layers 41b and 42b are provided. However, in this modified example, the structure is different from that of the foregoing second modified example in that a barrier film is not provided between the green conversion layer 41 and the red conversion layer 42.

As above, an adhesive corresponding to each phosphor may be used for the adhesive layers 41b and 42b in the green conversion layer 41 and the red conversion layer 42 in the structure in which the barrier film is not provided between the green conversion layer 41 and the red conversion layer 42. In the case where the interlayer barrier film is not provided, barrier performance is low compared to the case that the interlayer barrier film is provided. However, by using an adhesive capable of effectively inhibiting deterioration of a phosphor for every phosphor type, such lowering of barrier performance is able to be compensated.

Figure 10:
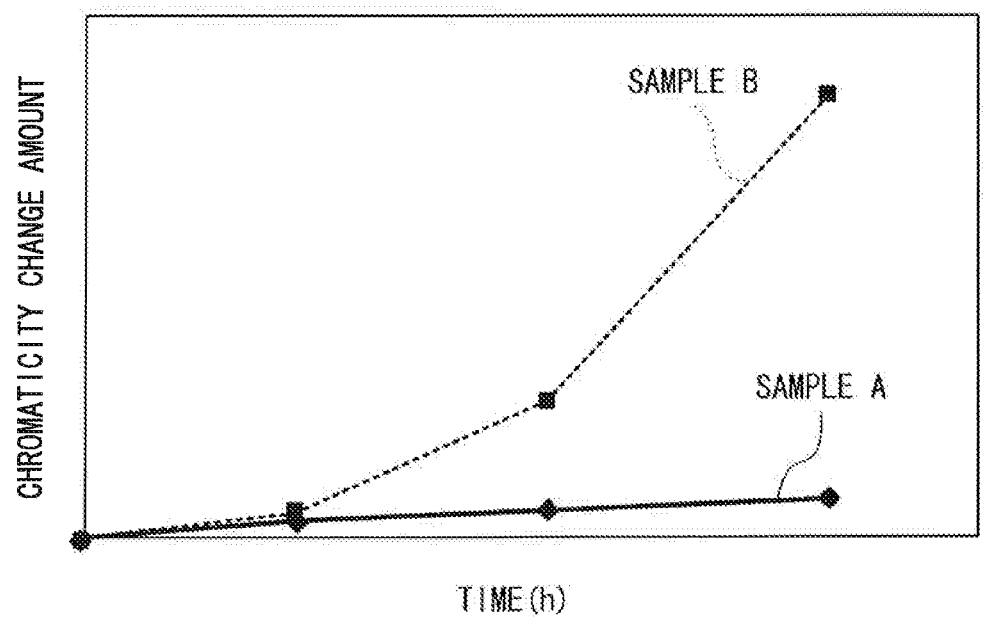
FIG. 10 is a diagram illustrating temporal change of color shift amounts according to Examples 2-1 and 2-2.

In the foregoing second and third modified examples, phosphor sheet samples (samples A and B) were practically formed, and deterioration of the phosphor (chromaticity change) was examined. Sample A had the structure according to the second modified example (including the barrier film 13C). Sample B had the structure according to the third modified example (not including the barrier film 13C). However, in the samples A and B, a phosphor emitting red light with the use of blue light as exciting light was used as a red phosphor; and a phosphor emitting green light with the use of blue light as exciting light was used as a green phosphor, respectively. For both the foregoing phosphors, a sulfide system phosphor whose deterioration was large under high temperature and high humidity was used. As an exciting light source, a blue LED was used. Samples A and B were left under environment of 60 deg C. and 90% RH, and the chromaticity change amount (Δu', v') from the initial point was measured. The results are illustrated in FIG. 10. As illustrated in FIG. 10, in particular, in the phosphor sheet 10C of the second modified example having the barrier film 13C, chromaticity change was not almost shown even after 500 hours elapsed.

In the foregoing first embodiment and the foregoing first to the third modified examples, the description has been given of the two layer structure composed of the red conversion layer containing the red phosphor and the green conversion layer containing the green phosphor as an example. However, a laminated structure composed of three or more layers may be used. In this case, two types of color conversion layers respectively containing each phosphor may be alternately layered by using two types of phosphors. Otherwise, three types or more of color conversion layers may be layered by using three types of phosphors.

FIRST APPLICATION EXAMPLE

Figure 11:
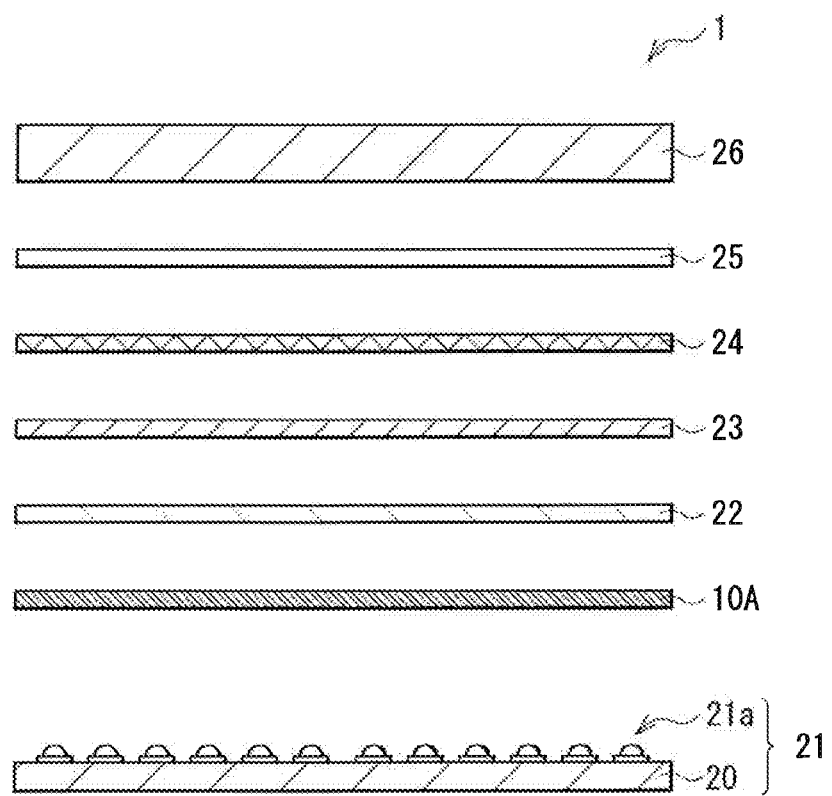
FIG. 11 is a schematic view illustrating a cross sectional structure of a display unit according to a first application example.

FIG. 11 schematically illustrates a cross sectional structure of a display unit 1 according to an application example (first application example) of the foregoing phosphor sheets 10A to 10D. However, a description will be given of the phosphor sheet 10A as a representative. The display unit 1 is, for example, a liquid crystal display. The display unit 1 includes a display panel 26 and a light source 21 as a backlight for illuminating the display panel 26. The display unit 1 sequentially includes the phosphor sheet 10A, a diffusion plate 22, a diffusion film 23, a lens film 24, and a reflective polarizing film 25 between the display panel 26 and the light source 21.

In the light source 21, a plurality of LEDs 21a are arranged on the substrate 20. The phosphor sheet 10A is arranged on the light emitting side of the light source section 21. The LED 21a is, for example, a blue light emitting diode.

The diffusion plate 22 and the diffusion film 23 diffuse incident light to uniformize the intensity distribution. Examples of material used for the diffusion plate 22 include a thermoplastic resin such as polycarbonate, polyethylene terephthalate, polyethylene naphthalate, polystyrene, polyether sulfone, and cyclic amorphous polyolefin, multifunctional acrylate, multifunctional polyolefin, unsaturated polyester, and an epoxy resin. In particular, a material whose deterioration due to a blue light emitting diode or a near-ultraviolet diode is slight is desirable. The thickness of the diffusion plate 22 is, for example, about from 1 mm to 3 mm both inclusive. The lens film 24 has a structure in which, for example, a plurality of projections in a state of a prism (in a state of a triangle pole) stand in line in the same plane. The lens film 24 has a function to focus incident light in the front face direction, for example. The reflective polarizing film 25 transmits one polarized light and reflects the other polarized light downward (light source section 21 side) to contribute to reusing light. The reflective polarizing film 25 is provided to improve light usage efficiency.

In the display panel 26, a liquid crystal layer is sealed between a drive substrate on which, for example, a TFT (Thin Film Transistor), various drive circuits, a pixel electrode and the like are formed and an opposed substrate on which a color filter, an opposed electrode and the like are formed (all elements are not illustrated). Each polarizing plate (not illustrated) is bonded to the light incidence side and the light emitting side of the display panel 26.

In the display unit 1, blue light emitted from the LED 21a passes the phosphor sheet 10A. At this time, the blue light entering the phosphor sheet 10A is color-converted to red light and green light as described above, which is finally emitted from the phosphor sheet 10A as white light. The white light emitted from the phosphor sheet 10A sequentially passes the diffusion plate 22, the diffusion film 23, the lens film 24, and the reflective polarizing film 25, and illuminates the display panel 26. The illuminated light is modulated based on image data in the display panel 26, and thereby image display is performed. As described above, by converting the blue light from the light source section 21 to white light by using the phosphor sheet 10A, chromaticity change and luminance change of illuminated light are able to be decreased.

Figure 12:
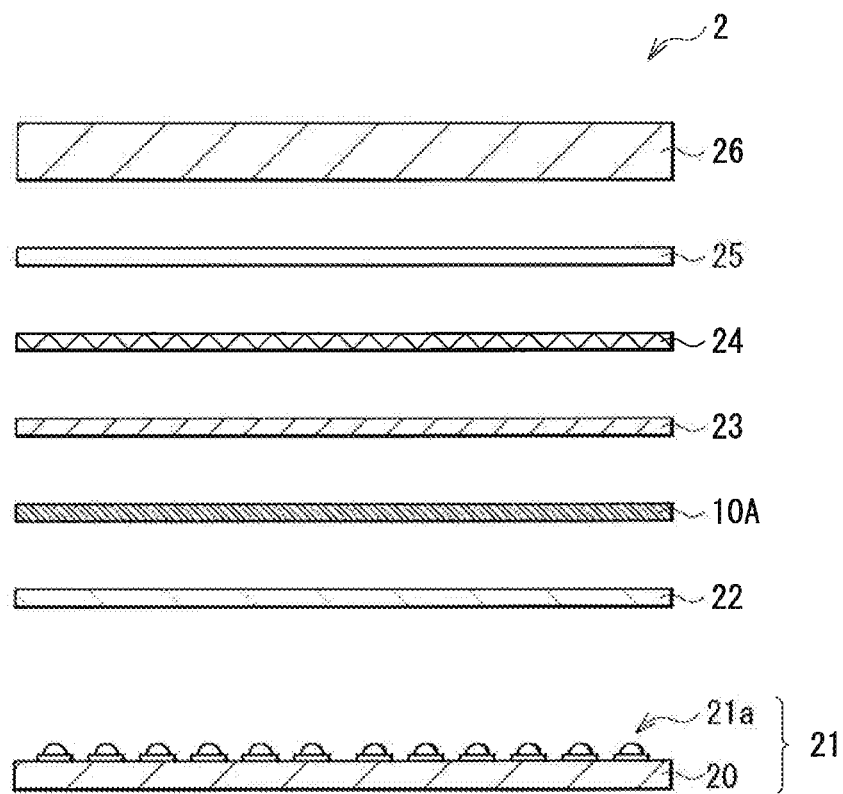
FIG. 12 is a schematic view illustrating a cross sectional structure of the display unit according to the first application example.

In the foregoing first application example, the phosphor sheet 10A is provided directly above the light source section 21. However, the arrangement location of the phosphor sheet 10A is not particularly limited. For example, as a display unit 2 illustrated in FIG. 12, a structure in which the phosphor sheet 10A is located between the diffusion plate 22 and the diffusion film 23 may be also adopted.

SECOND APPLICATION EXAMPLE

Figure 13:
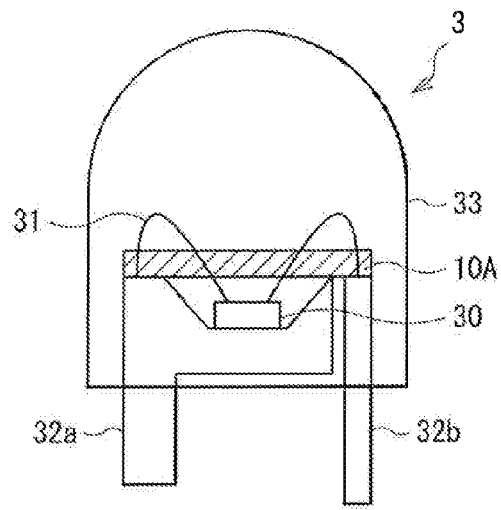
FIG. 13 is a schematic view illustrating a cross sectional structure of a illuminating device according to a second application example.

FIG. 13 schematically illustrates a cross sectional structure of a illuminating device (illuminating device 3) according to an application example (second application example) of the foregoing phosphor sheets 10A to 10D. However, a description will be given of the phosphor sheet 10A as a representative. The illuminating device 3 is, for example, a white LED. In the illuminating device 3, the phosphor sheet 10A is arranged directly above a diode chip 30. The diode chip 30 is a light emitting element that emits blue light, and is electrically connected to a cathode frame 32a and an anode frame 32b by a wire bond 31. The diode chip 30 and the phosphor sheet 10A are hermetically sealed with a package cap 33.

In the illuminating device 3, blue light emitted from the diode chip 30 is color-converted in the phosphor sheet 10A, which is emitted outside as white light. As described above, the phosphor sheet 10A may be arranged directly above the diode chip 30. Thereby, a white LED with small chromaticity change and small luminance change is able to be formed.

THIRD APPLICATION EXAMPLE

Figure 14A:
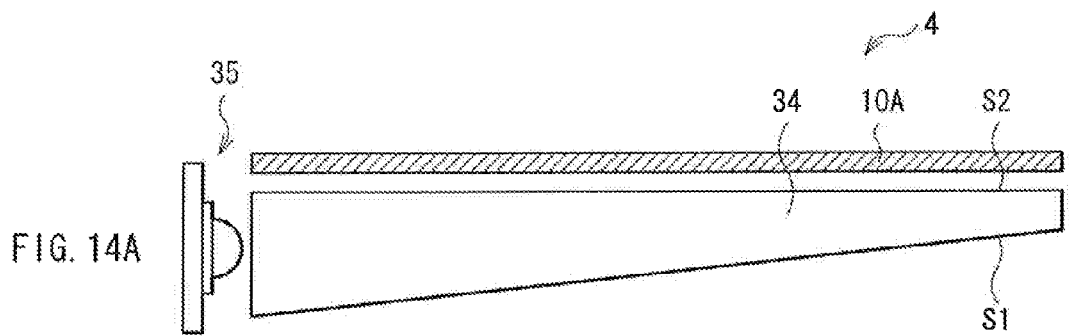
FIGS. 14A and 14B are schematic views illustrating a cross sectional structure of a illuminating device according to a third application example.

FIG. 14A schematically illustrates a cross sectional structure of a illuminating device (illuminating device 4) according to an application example (third application example) of the foregoing phosphor sheets 10A to 10D. However, a description will be given of the phosphor sheet 10A as a representative. The illuminating device 4 is used, for example, as a backlight of a liquid crystal display or the like. For example, a blue LED 35 is arranged on the side face of a light guide plate 34 in the shape of a wedge. The shape of the light guide plate 34 is not limited to the wedge, but may be in a state of a parallel plate. Examples of material of the light guide plate 34 include a thermoplastic resin such as polycarbonate, polyethylene terephthalate, polyethylene naphthalate, polystyrene, polyether sulfone, and cyclic amorphous polyolefin, multifunctional acrylate, multifunctional polyolefin, unsaturated polyester, and an epoxy resin as the material of the diffusion plate 22 of the foregoing first application example. A reflecting face S1 of the light guide plate 34 is provided with, for example, groove process, dot process or the like for extracting light. The phosphor sheet 10A is provided on a light emitting face S2 of the light guide plate 34.

In the illuminating device 4, blue light entering from the blue LED 35 into the light guide plate 34 is totally reflected and propagated through the light guide plate 34. After that, the total reflection condition is collapsed by process provided for the reflecting face S1, and the blue light is emitted from the light emitting face S2. The blue light emitted from the light guide plate 34 is color-converted in the phosphor sheet 10A. Thereby, white light with small chromaticity change or the like is able to be obtained.

Figure 14B:
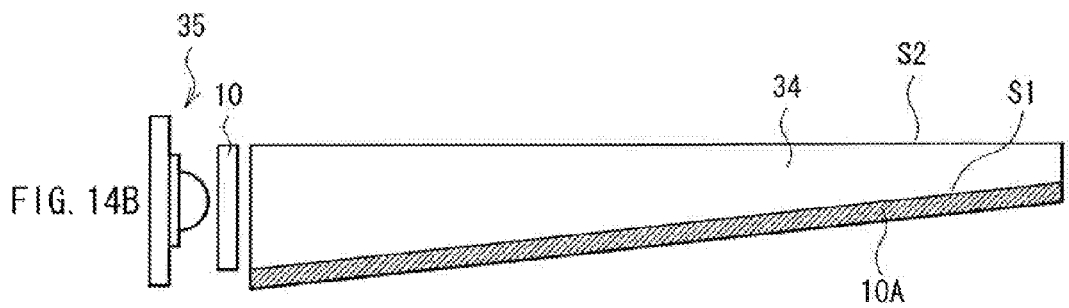

In the foregoing third application example, a description has been given of the example that the phosphor sheet 10A is provided on the light emitting face S2 of the light guide plate 34. However, for example, as illustrated in FIG. 14B, the phosphor sheet 10A may be bonded with the reflecting face S1 of the light guide plate 34. In this case, at the time when the total reflection condition of the blue light propagated in the light guide plate 34 is collapsed in the reflecting face S1, the blue light passes the phosphor sheet 10A and is color-converted. Thus, white light with small chromaticity change or the like is able to be obtained.

Second Embodiment

Structure of Diffusion Plate 50A

Figure 15:
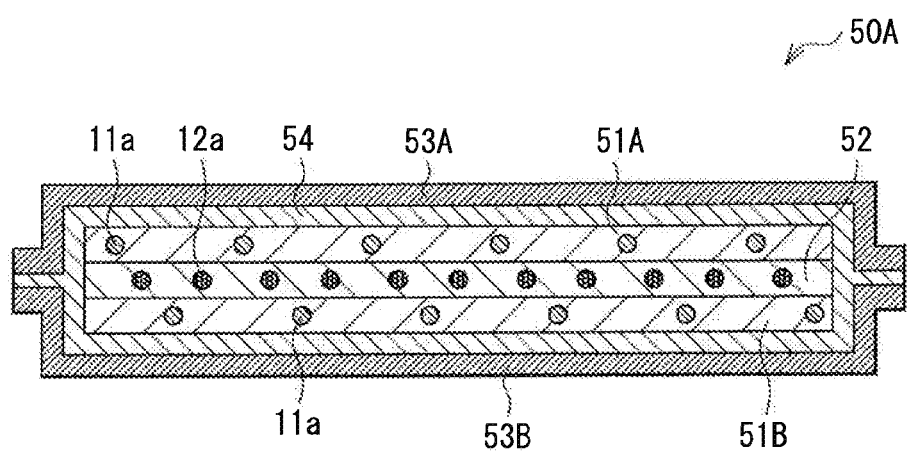
FIG. 15 is a schematic view illustrating a cross sectional structure of a diffusion plate according to a second embodiment.

FIG. 15 schematically illustrates a cross sectional structure of a diffusion plate (diffusion plate 50A) according to the second embodiment. The diffusion plate 50A is sealed in a state that a red conversion diffusion plate 52 and green conversion diffusion plates 51A and 51B are layered between barrier films 53A and 53B (a pair of base materials). The red conversion diffusion plate 52 functions as a color conversion layer for converting part of blue light to red light, and has a diffusion function to uniformly diffuse incident light. The green conversion diffusion plates 51A and 51B function as a color conversion layer for converting part of blue light to green light, and has a diffusion function to uniformly diffuse incident light. That is, as in the foregoing first embodiment, the diffusion plate 50A has a laminated structure in which each layer separately exists for every phosphor type. In the following description, for elements similar to those of the phosphor sheet 10A of the foregoing first embodiment, the same referential symbols are affixed thereto, and the description will be omitted as appropriate. The red conversion diffusion plate 52 and the green conversion diffusion plates 51A and 51B are a specific example of "color conversion layer" of the invention.

However, in this embodiment, the red phosphor 12a is contained in the red conversion diffusion plate 52, and the green phosphor 11a is contained in the green conversion diffusion plates 51A and 51B, respectively. It is structured as a three layer laminated structure in which the green conversion diffusion plates 51A and 51B are provided to sandwich the red conversion diffusion plate 52.

The red conversion diffusion plate 52 contains the red phosphor 12a in a dispersed state. The red phosphor 12a is kneaded in a resin material as the base material thereof in the course of formation of the red conversion diffusion plate 52. Thereby, the red phosphor 12a is dispersed and held in the red conversion diffusion plate 52.

Similarly, the green conversion diffusion plates 51A and 51B respectively contain the green phosphor 11a in a dispersed state. The green phosphor 11a is dispersed and held in the green conversion diffusion plates 51A and 51B in the course of formation of the green conversion diffusion plates 51A and 51B.

The barrier films 53A and 53B are a protective sheet for sealing and protecting the red conversion diffusion plate 52 and the green conversion diffusion plates 51A and 51B. Examples of material of the barrier films 53A and 53B include a transparent resin similar to the material of the barrier films 13A and 13B of the foregoing first embodiment. A material having a relatively low barrier performance such as moisture vapor transmittance of about from 0.05 to 5 g/m2/day is suitably used.

In this embodiment, an adhesive layer 54 is provided to cover the top face and the bottom face of the laminated structure composed of the red conversion diffusion plate 52 and the green conversion diffusion plates 51A and 51B. The adhesive layer 54 is intended to seal the laminated structure between the barrier films 53A and 53B. Examples of material of the adhesive layer 54 include a urea resin system, a melamine resin system, a phenol resin system, a resorcinol resin system, an epoxy resin system, a polyurethane resin system, a polyimide system, a polybenzimidazole system, a polyester resin system, a vinyl acetate resin system, a polyvinyl acetal system, a polyvinyl alcohol system, a vinyl chloride resin system, a cyanoacrylate system, a polyether acrylate system, a polyethylene system, a cellulose system, a chloroprene rubber system, a nitrile rubber system, an SBR system, an SIS system, a polysulfide system, a butyl rubber system, a silicone rubber system, vinylphenolic, epoxyphenolic, chloroprenephenolic, nirilephenolic, nylon epoxy, and nitrile epoxy. A single half on the barrier film 53A side of the adhesive layer 54 and a single half on the barrier film 53B side of the adhesive layer 54 respectively correspond to "first adhesive layer" and "second adhesive layer" according to an embodiment.

However, as a material of the adhesive layer 54, an adhesive capable of effectively inhibiting deterioration of phosphor according to each phosphor type (compatible adhesive) is desirably selected as in the foregoing second modified example.

Specifically, combination of the green phosphor 11a and an acrylic adhesive, and combination of the red phosphor 12a and a butyl rubber adhesive are respectively suitable. More specifically, an adhesive compatible with the phosphor arranged on the outermost side (the barrier film 53A side and the barrier film 53B side) in the laminated structure, in other words, an adhesive compatible with the phosphor contained in the diffusion plate adjacent to the adhesive layer 54 is selected. For example, the green conversion diffusion plates 51A and 51B containing the green phosphor 11a are arranged on the outermost side. Thus, an adhesive compatible with the green phosphor 11a, that is, the acrylic adhesive is desirably used.

Operation and Effect of Diffusion Plate 50A

In this embodiment, in the case where blue light enters a face of the diffusion plate 50A, for example, the barrier film 53B side, the incident blue light sequentially passes the green conversion diffusion plate 51B, the red conversion diffusion plate 52, and the green conversion diffusion plate 51A. In the course of light passing, part of the blue light is color-converted to red light and green light, respectively, which is emitted from the barrier film 53A side. The green light and the red light are mixed with blue light that has not been color-converted and has passed, and thereby white light is obtained.

Figure 16:
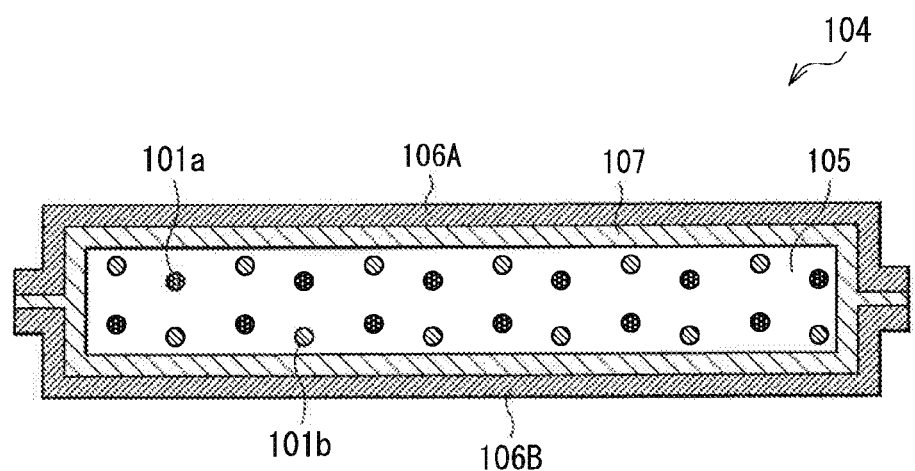
FIG. 16 is a schematic view illustrating a cross sectional structure of a diffusion plate according to a comparative example.

A description will be given of a diffusion plate 104 according to Comparative example 3 with reference to FIG. 16. The diffusion plate 104 has a color conversion diffusion plate 105 between a pair of high barrier films 106A and 106B. In the color conversion diffusion plate 105, the green phosphor 101a and the red phosphor 101b are mixed and contained. The color conversion diffusion plate 105 is sealed between the high barrier films 106A and 106B with an adhesive layer 107 in between. That is, since the green phosphor 101a and the red phosphor 101b are mixed in the diffusion plate 104 of Comparative example 3, the material of the adhesive layer 107 is not able to be selected according to suitable combination of a phosphor and an adhesive as described above. Thus, the deterioration rate of the green phosphor 101a is different from the deterioration rate of the red phosphor 101b. In the result, temporal change of white chromaticity is increased in some cases. Thus, in the diffusion plate 104, in order to inhibit deterioration of the phosphor, the expensive high barrier films 106A and 106B with moisture vapor transmittance of about 0.01 g/m$^2$/day or less are desirably used.

Meanwhile, this embodiment had a laminated structure in which each layer separately exists for every phosphor type (red phosphor 12a and the green phosphor 11b), and the red conversion diffusion plate 52 is sandwiched between the green conversion diffusion plates 51A and 51B. By adopting such a laminated structure, an adhesive compatible with the phosphor that is arranged on the outermost side that is susceptible to moisture vapor or the like is able to be selected. Further, the internal layer of the laminated structure (red conversion diffusion plate 52) is sandwiched between other diffusion plates (green conversion diffusion plates 51A and 51B) from above and from beneath. Thus, it becomes hard to be affected by moisture vapor, and the phosphor is hard to deteriorate. Thereby, the difference between respective deterioration rates of the respective fluorescence types, that is, the difference between respective deterioration rates of respective color is decreased, and temporal change of chromaticity of white light is inhibited.

As described above, this embodiment has the laminated structure composed of the red conversion diffusion plate 52 containing the red phosphor 12a and the green conversion diffusion plates 51A and 51B containing the green phosphor 11a. Thus, deterioration of the phosphor is easily inhibited by using effect of combination of the phosphor and the adhesive. Thereby, deterioration of the phosphor is able to be inhibited while for example, an inexpensive film (PET, PEN or the like) that is widely used for a food packaging or the like is used as the barrier films 53A and 53B sandwiching the laminated structure. Thus, deterioration of the phosphor is able to be inhibited at low cost. Further, by inhibiting deterioration of the phosphor, chromaticity change and luminance change after long time usage are able to be decreased.

In the foregoing second embodiment, the description has been given of the specific example of the three layer laminated structure in which the diffusion plate containing the red phosphor is sandwiched between two diffusion plates containing the green phosphor. However, the laminated structure of the diffusion plate is not limited thereto. For example, a structure in which n or more layers (n represents an odd number of 5 or more) of the two types of diffusion plates are alternately layered may be adopted. In the case where the number of phosphor types is two, and each diffusion plate containing each phosphor is alternately layered, if the number of layers is an odd number, the outermost two layers become a diffusion plate containing the same type of phosphor. Thus, in the same manner as that of the foregoing second embodiment, as the adhesive layer 54, an adhesive compatible with the phosphor of the foregoing two layers may be selected.

Further, a three layer laminated structure in which a diffusion plate containing a green phosphor is sandwiched between two diffusion plates containing a red phosphor may be adopted. In this case, the diffusion plate containing the red phosphor is adjacent to the adhesive layer 54. Thus, as a material of the adhesive layer 54, an adhesive compatible with the red phosphor such as a butyl rubber adhesive may be selected.

Next, a description will be given of a modified example (fourth modified example) of the foregoing second embodiment. For elements similar to those of the first embodiment and the second embodiment, the same referential symbols are affixed thereto, and the description thereof will be omitted as appropriate.

FOURTH MODIFIED EXAMPLE

Figure 17:
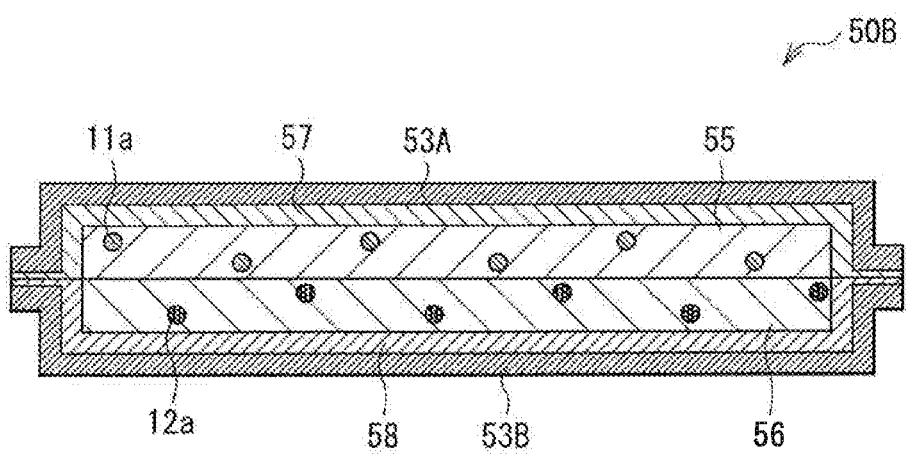
FIG. 17 is a schematic view illustrating a cross sectional structure of a diffusion plate according to a fourth modified example.

FIG. 17 schematically illustrates a cross sectional structure of a diffusion plate 50B according to the fourth modified example. The diffusion plate 50B is sealed in a state that a red conversion diffusion plate 56 and a green conversion diffusion plate 55 are layered between the barrier films 53A and 53B. The red conversion diffusion plate 56 has a color conversion function and a diffusion function similar to those of the red conversion diffusion plate 52 of the foregoing second embodiment. The green conversion diffusion plate 55 has a color conversion function and a diffusion function similar to those of the green conversion diffusion plates 51A and 51B of the foregoing second embodiment. That is, as in the foregoing first and the foregoing second embodiments, the diffusion plate 50B has a laminated structure in which each layer separately exists for every phosphor type. However, the laminated structure of this modified example is a two layer structure composed of the red conversion diffusion plate 56 and the green conversion diffusion plate 55. The green conversion diffusion plate 55 is arranged on the barrier film 53A side, and the red conversion diffusion plate 56 is arranged on the barrier film 53B side. Further, an adhesive layer 57 (first adhesive layer) is provided on the barrier film 53A side, and an adhesive layer 58 (second adhesive layer) is provided on the barrier film 53B side, respectively. For the adhesive layers 57 and 58, different adhesives are used.

The adhesive layers 57 and 58 are intended to seal the laminated structure between the barrier films 53A and 53B. Examples of material of the adhesive layers 57 and 58 include a urea resin system, a melamine resin system, a phenol resin system, a resorcinol resin system, an epoxy resin system, a polyurethane resin system, a polyimide resin system, a polybenzimidazole system, a polyester resin system, a vinyl acetate resin system, a polyvinyl acetal system, a polyvinyl alcohol system, a vinyl chloride resin system, a cyanoacrylate system, a polyether acrylate system, a polyethylene system, a cellulose system, a chloroprene rubber system, a nitrile rubber system, an SBR system, an SIS system, a polysulfide system, a butyl rubber system, a silicon rubber system, vinylphenolic, epoxyphenolic, chloroprenephenolic, nirilephenolic, nylon epoxy, and nitrile epoxy. As in the foregoing second embodiment, an adhesive compatible with the phosphor contained in an adjacent diffusion plate is desirably selected. Specifically, an acrylic adhesive is desirably used as the adhesive layer 57, and a butyl rubber adhesive is desirably used as the adhesive layer 58.

As in this modified example, the laminated structure may be a two layer structure composed of the red conversion diffusion plate 56 and the green conversion diffusion plate 55. In this case, by providing the adhesive layers 57 and 58 made of different adhesives on the respective sides of the barrier films 53A and 53B, effect equal to that of the foregoing second embodiment is able to be obtained.

In the foregoing fourth modified example, the description has been given of the specific example of the two layer laminated structure in which the diffusion plate containing the red phosphor and the diffusion plate containing the green phosphor are layered. However, the laminated structure of the diffusion plate is not limited thereto. For example, a structure in which m or more layers (m represents an even number of 4 or more) of the two types of diffusion plates are alternately layered may be adopted. In the case where the number of phosphor types is two, and each diffusion plate containing each phosphor is alternately layered, if the number of layers is an even number, the outermost two layers become a diffusion plate containing different types of phosphors. Thus, in the same manner as that of the foregoing fourth modified example, it is possible that the adhesive layers 57 and 58 made of different adhesives are provided on the respective sides of the barrier films 53A and 53B, and an adhesive compatible with each phosphor for the adhesive layers 57 and 58 is selected, respectively.

Further, in the foregoing second embodiment and the fourth modified example, the description has been given of the specific example of the structure in which two types of phosphors are contained in each diffusion plate different from each other, and the two types of diffusion plates are alternately layered. However, the diffusion plates are not necessarily alternately layered, and the number of phosphor types is not limited to two.

While the present application has been described with reference to the embodiments and the modified examples, the present application is not limited to the foregoing embodiments and the like, and various modifications may be made. For example, in the foregoing embodiments and the like, the description has been given of the case that the red phosphor and the green phosphor that use blue light as exciting light are used as an example. However, other type of phosphor may be used. For example, as a yellow conversion phosphor, $(Y, Gd)_3(Al, Ga)_5O_{12}:Ce^{3+}$ (commonly called YAG: $Ce^{3+}$), $\alpha$-SiAlON:$Eu^{2+}$ or the like may be used. Further, as a yellow or green conversion phosphor, $(Ca, Sr, Ba)2SiO4:Eu^{2+}$ or the like may be used. Further, the number of phosphors to be used may be three or more.

Further, in the foregoing embodiments and the like, the description has been given of the blue LED as an exciting light source as an example. However, the light source is not limited thereto, and a light source emitting color light in a relatively short wavelength region such as a near-ultraviolet LED may be used. In this case, as a green conversion or yellow conversion phosphor, $(Ca, Sr, Ba)_2SiO_4:Eu^{2+}$, BAM:$Eu^{2+}$, $Mn^{2+}$, $\alpha$-SiAlON:$Eu^{2+}$ or the like may be used. As a red conversion phosphor, $Y_2O_2S: Eu^{3+}$, $La_2O_2S:Eu^{3+}$, $(Ca, Sr, Ba)_2Si_5N_8:Eu^{2+}$, $CaAlSiN_3:Eu^{2+}$, $LiEuW_2O_8$, $Ca(Eu, La)_4Si_3O_{13}$, $Eu_2W_2O_9$ system, $(La, Eu)_2W_3O_{12}$, $(Ca, Sr, Ba)_3MgSi_2O_8:Eu^{2+}$, $Mn^{2+}$, $CaTiO_3:Pr^{3+}$, $Bi^{3+}$ or the like may be used. As a blue conversion phosphor, BAM:$Eu^{2+}$, $(Ca, Sr, Ba)_5(PO_4)_3Cl:Eu^{2+}$ or the like may be used. However, in terms of light emitting efficiency and weather resistance, the blue light emitting diode is preferably used.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A phosphor sheet having a laminated structure comprising:
   a first barrier material;
   a first color conversion layer provided on the first barrier material, the first color conversion layer including a first color phosphor dispersed in a first resin layer;
   a second color conversion layer provided on the first color conversion layer, the second color conversion layer including a second color phosphor dispersed in a second resin layer; and
   a second barrier material provided on the second color conversion layer,
   wherein the first and second barrier materials have a moisture vapor transmittance of $0.05^2$/day to 5 g/m$^2$/day.

2. A phosphor sheet according to claim 1, comprising a third barrier material provided between the first and second color conversion layers.

3. A phosphor sheet having a laminated structure comprising:
   a first barrier material;
   a first color conversion layer provided on the first barrier material, the first color conversion layer including a first color phosphor dispersed in a first resin layer;
   a second color conversion layer provided on the first color conversion layer, the second color conversion layer including a second color phosphor dispersed in a second resin layer; and
   a second barrier material provided on the second color conversion layer,
   wherein the first and second barrier materials include a resin selected from the group consisting of: polycarbonate; polyethylene terephthalate; polyethylene naphthalate; polystyrene; polyether sulfone; cyclic amorphous polyolefin; a multifunctional acrylate; a multifunctional polyolefin; an unsaturated polyester; and an epoxy resin.

4. A phosphor sheet having a laminated structure comprising:
   a first barrier material;
   a first color conversion layer provided on the first barrier material, the first color conversion layer including a first color phosphor dispersed in a first resin layer;
   a second color conversion layer provided on the first color conversion layer, the second color conversion layer including a second color phosphor dispersed in a second resin layer; and
   a second barrier material provided on the second color conversion layer.
   wherein the first resin layer includes a first adhesive which inhibits deterioration of the first color phosphor and the second resin layer includes a second adhesive which inhibits deterioration of the second color phosphor.

5. A phosphor sheet according to claim 4, wherein the first and second adhesives are different.

6. A phosphor sheet according to claim 4, wherein the first adhesive is an acrylic adhesive and the second adhesive is a butyl rubber adhesive.

7. A display unit comprising:
   a display panel;
   a light source; and
   a phosphor sheet through which light emitted from the light source passes to illuminate the display panel,
   wherein the phosphor sheet has a laminated structure comprising:
   a first barrier material;
   a first color conversion layer provided on the first barrier material, the first color conversion layer including a first color phosphor dispersed in a first resin layer;
   a second color conversion layer provided on the first color conversion layer, the second color conversion layer including a second color phosphor dispersed in a second resin layer; and
   a second barrier material provided on the second color conversion layer,
   wherein the first and second barrier materials have a moisture vapor transmittance of 0.05 g/m$^2$/day to 5 g/m$^2$/day.

8. A display unit according to claim 7, wherein the phosphor sheet comprises a third barrier material provided between the first and second color conversion layers.

9. A display unit comprising:
a display panel:
a light source; and
a phosphor sheet through which light emitted from the light source passes to illuminate the display panel,
wherein the phosphor sheet has a laminated structure comprising:
a first barrier material;
a first color conversion layer provided on the first barrier material, the first color conversion layer including a first color phosphor dispersed in a first resin layer:
a second color conversion layer provided on the first color conversion layer, the second color conversion layer including a second color phosphor dispersed in a second resin layer; and
a second barrier material provided on the second color conversion layer,
wherein the first resin layer includes a first adhesive which inhibits deterioration of the first color phosphor and the second resin layer includes a second adhesive which inhibits deterioration of the second color phosphor.

10. A display unit according to claim 9, wherein the first and second adhesives are different.

11. A display unit comprising:
a display panel:
a light source; and
a phosphor sheet through which light emitted from the light source passes to illuminate the display panel,
wherein the phosphor sheet has a laminated structure comprising:
a first barrier material;
a first color conversion layer provided on the first barrier material, the first color conversion layer including a first color phosphor dispersed in a first resin layer;
a second color conversion layer provided on the first color conversion layer, the second color conversion layer including a second color phosphor dispersed in a second resin layer; and
a second barrier material provided on the second color conversion layer,
wherein the light source includes a plurality of light emitting diodes arranged on a light emitting side of a substrate.

12. A display unit comprising:
a display panel;
a light source; and
a phosphor sheet through which light emitted from the light source passes to illuminate the display panel,
wherein the phosphor sheet has a laminated structure comprising:
a first barrier material;
a first color conversion layer provided on the first barrier material, the first color conversion layer including a first color phosphor dispersed in a first resin layer;
a second color conversion layer provided on the first color conversion layer, the second color conversion layer including a second color phosphor dispersed in a second resin layer; and
a second barrier material provided on the second color conversion layer,
wherein the light source includes a light emitting diode arranged at a side face of a light guide plate.

13. A display unit comprising:
a display panel;
a light source; and
a phosphor sheet through which light emitted from the light source passes to illuminate the display panel,
wherein the phosphor sheet has a laminated structure comprising:
a first barrier material;
a first color conversion layer provided on the first barrier material, the first color conversion layer including a first color phosphor dispersed in a first resin layer;
a second color conversion layer provided on the first color conversion layer, the second color conversion layer including a second color phosphor dispersed in a second resin layer; and
a second barrier material provided on the second color conversion layer,
wherein the phosphor sheet converts non-white light emitted from the light source to white light to illuminate the display panel.

14. An illuminating device comprising:
a light source; and
a phosphor sheet through which light emitted from the light source passes,
wherein the phosphor sheet has a laminated structure comprising:
a first barrier material;
a first color conversion layer provided on the first barrier material, the first color conversion layer including a first color phosphor dispersed in a first resin layer;
a second color conversion layer provided on the first color conversion layer, the second color conversion layer including a second color phosphor dispersed in a second resin layer; and
a second barrier material provided on the second color conversion layer,
wherein the first and second barrier materials have a moisture vapor transmittance of 0.05 $g/m^2/day$ to 5 $g/m^2/day$.

15. An illuminating device according to claim 14, wherein the phosphor sheet comprises a third barrier material provided between the first and second color conversion layers.

16. An illuminating device comprising:
a light source; and
a phosphor sheet through which light emitted from the light source passes,
wherein the phosphor sheet has a laminated structure comprising:
a first barrier material;
a first color conversion layer provided on the first barrier material, the first color conversion layer including a first color phosphor dispersed in a first resin layer;
a second color conversion layer provided on the first color conversion layer, the second color conversion layer including a second color phosphor dispersed in a second resin layer; and
a second barrier material provided on the second color conversion layer,
wherein the first resin layer includes a first adhesive which inhibits deterioration of the first color phosphor and the second resin layer includes a second adhesive which inhibits deterioration of the second color phosphor.

17. An illuminating device comprising:
a light source; and
a phosphor sheet through which light emitted from the light source passes, wherein the phosphor sheet has a laminated structure comprising:
- a first barrier material;
- a first color conversion layer provided on the first barrier material, the first color conversion layer including a first color phosphor dispersed in a first resin layer;
- a second color conversion layer provided on the first color conversion layer, the second color conversion layer including a second color phosphor dispersed in a second resin layer; and
- a second barrier material provided on the second color conversion layer,
- wherein the first and second adhesives are different.

18. An illuminating device according to claim 14, wherein the light source is a light-emitting diode chip.

19. An illuminating device according to claim 18, wherein the phosphor sheet is arranged above the light-emitting diode chip.

20. An illuminating device according to claim 14, wherein the illuminating device is used in a backlight device for a liquid crystal display.

21. An illuminating device according to claim 14, wherein the light source includes a plurality of light emitting diodes arranged on a light emitting side of a substrate.

22. An illuminating device comprising:
a light source; and
a phosphor sheet through which light emitted from the light source passes,
wherein the phosphor sheet has a laminated structure comprising:
- a first barrier material;
- a first color conversion layer provided on the first barrier material, the first color conversion layer including a first color phosphor dispersed in a first resin layer;
- a second color conversion layer provided on the first color conversion layer, the second color conversion layer including a second color phosphor dispersed in a second resin layer; and
- a second barrier material provided on the second color conversion layer,
- wherein the light source includes a light emitting diode arranged at a side face of a light guide plate.

23. An illuminating device comprising:
a light source; and
a phosphor sheet through which light emitted from the light source passes,
wherein the phosphor sheet has a laminated structure comprising:
- a first barrier material;
- a first color conversion layer provided on the first barrier material, the first color conversion layer including a first color phosphor dispersed in a first resin layer;
- a second color conversion layer provided on the first color conversion layer, the second color conversion layer including a second color phosphor dispersed in a second resin layer; and
- a second barrier material provided on the second color conversion layer,
- wherein the phosphor sheet converts non-white light emitted from the light source to white light.

24. A diffusion plate comprising: a first barrier material; a second barrier material; a laminated structure provided between the first and second barrier materials, the laminated structure comprising a first color conversion diffusion plate and a second color conversion diffusion plate provided on the first color conversion diffusion plate; a first adhesive layer provided on a top face of the laminated structure to seal the laminated structure to the first barrier material; and a second adhesive layer provided on a bottom face of the laminated structure to seal the laminated structure to the second barrier material; wherein the first color diffusion plate includes a first color phosphor dispersed therein and the second color diffusion plate includes a second color phosphor dispersed therein.

25. A diffusion plate according to claim 24, wherein the laminated structure comprises a third color diffusion plate including the first color phosphor dispersed therein, wherein the first and third color diffusion plates are provided on opposite sides of the second color diffusion plate to sandwich the second color diffusion plate between the first and third color diffusion plates.

26. A diffusion plate according to claim 25, wherein the first and second adhesive layers include an adhesive which inhibits deterioration of the first color phosphor.

27. A diffusion plate according to claim 24, wherein the first adhesive layer includes a first adhesive which inhibits deterioration of the first color phosphor and the second adhesive layer includes a second adhesive which inhibits deterioration of the second color phosphor.

28. A diffusion plate according to claim 24, wherein the first and second barrier materials have a moisture vapor transmittance of 0.05 $g/m^2/day$ to 5 $g/m^2/day$.

29. A display unit comprising: a display panel; a light source; and a diffusion plate through which light emitted from the light source passes to illuminate the display panel, wherein the diffusion plate comprises: a first barrier material; a second barrier material; a laminated structure provided between the first and second barrier materials, the laminated structure comprising a first color conversion diffusion plate and a second color conversion diffusion plate; a first adhesive layer provided on a top face of the laminated structure to seal the laminated structure to the first barrier material; and a second adhesive layer provided on a bottom face of the laminated structure to seal the laminated structure to the second barrier material, and wherein the first color diffusion plate includes a first color phosphor dispersed therein and the second color diffusion plate includes a second color phosphor dispersed therein.

30. A display unit according to claim 29, wherein the laminated structure comprises a third color diffusion plate including the first color phosphor dispersed therein, wherein the first and third color diffusion plates are provided on opposite sides of the second color diffusion plate to sandwich the second color diffusion plate between the first and third color diffusion plates.

31. A display unit according to claim 29, wherein the light source includes a plurality of light emitting diodes arranged on a light emitting side of a substrate.

32. A display unit according to claim 29, wherein the diffusion plate converts non-white light emitted from the light source to white light to illuminate the display panel.

33. A phosphor sheet according to claim 3, comprising a third barrier material provided between the first and second color conversion layers.

34. A phosphor sheet according to claim 4, comprising a third barrier material provided between the first and second color conversion layers.

* * * * *